United States Patent
Patel et al.

(10) Patent No.: US 10,895,806 B2
(45) Date of Patent: Jan. 19, 2021

(54) IMPRINTING METHOD AND APPARATUS

(71) Applicant: CANON KABUSHIKI KAISHA, Tokyo (JP)

(72) Inventors: Mehul N. Patel, Austin, TX (US); Edward Brian Fletcher, Austin, TX (US); Seth J. Bamesberger, Austin, TX (US); Alireza Aghili, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 232 days.

(21) Appl. No.: 16/106,147

(22) Filed: Aug. 21, 2018

(65) Prior Publication Data

US 2019/0101823 A1    Apr. 4, 2019

Related U.S. Application Data

(60) Provisional application No. 62/565,363, filed on Sep. 29, 2017.

(51) Int. Cl.
*G03F 7/00* (2006.01)
*B29C 59/02* (2006.01)
(Continued)

(52) U.S. Cl.
CPC ........ *G03F 7/0002* (2013.01); *G03F 7/70858* (2013.01); *G03F 7/70908* (2013.01);
(Continued)

(58) Field of Classification Search
CPC .................. G03F 7/0002; B29C 2059/023
See application file for complete search history.

(56) References Cited

U.S. PATENT DOCUMENTS 5,997,963 A  * 12/1999 Davison .................. C23C 16/44
                                                                  427/582
6,764,386 B2 *  7/2004 Uziel ................ H01L 21/67017
                                                                  451/36
(Continued)

FOREIGN PATENT DOCUMENTS

GB          2501681 A      11/2013
WO      2007/123805 A2     11/2007

OTHER PUBLICATIONS

Amir Tavakkoli Kermani Ghariehali, Edward Brian Fletcher, U.S. Appl. No. 15/720,308, filed Sep. 29, 2017.

*Primary Examiner* — Benjamin A Schiffman
(74) *Attorney, Agent, or Firm* — Daniel Ratoff

(57) ABSTRACT

A method, a system, and a controller for imprinting. Apply droplets of a formable material to imprint region of substrate. A partial pressure of formable material develops at a fluid-gas interface. A portion of an imprinting surface of a mesa on a template at an initial contact time is brought into contact with the droplets. The droplets merge and flow towards an imprint edge interface. A first gas flows in the imprint region prior to the initial contact time. A second gas flows into the imprint edge interface and region between the template and the substrate after the initial contact time. The template and the flow of the second gas reduces the partial pressure of the formable material below a vapor pressure of the formable material in a portion of the gap region adjacent to the fluid-gas interface at the imprint edge interface.

18 Claims, 12 Drawing Sheets

(51) Int. Cl.
*G03F 7/20* (2006.01)
*G03F 7/16* (2006.01)

(52) U.S. Cl.
CPC ........ *B29C 2059/023* (2013.01); *G03F 7/167* (2013.01); *G03F 7/168* (2013.01); *G03F 7/2041* (2013.01)

(56) References Cited

U.S. PATENT DOCUMENTS

| | | | |
|---|---|---|---|
| 6,869,890 B2* | 3/2005 | Noji | B08B 3/04 |
| | | | 118/720 |
| 6,936,194 B2 | 8/2005 | Watts | |
| 7,019,819 B2* | 3/2006 | Choi | B29C 43/003 |
| | | | 355/53 |
| 7,137,803 B2* | 11/2006 | Chou | B29C 43/003 |
| | | | 425/405.1 |
| 7,157,036 B2 | 1/2007 | Choi et al. | |
| 7,316,554 B2* | 1/2008 | Choi | B29C 43/003 |
| | | | 264/293 |
| 7,377,764 B2* | 5/2008 | Kruijt-Stegeman | B82Y 10/00 |
| | | | 264/401 |
| 7,462,028 B2* | 12/2008 | Cherala | B29C 43/003 |
| | | | 425/385 |
| 7,490,547 B2 | 2/2009 | Van Santen et al. | |
| 7,531,025 B2* | 5/2009 | McMackin | B82Y 10/00 |
| | | | 216/9 |
| 8,066,930 B2 | 11/2011 | Sreenivasan et al. | |
| 8,076,386 B2 | 12/2011 | Xu et al. | |
| 8,144,309 B2* | 3/2012 | Wuister | B82Y 10/00 |
| | | | 355/72 |
| 8,202,463 B2* | 6/2012 | Yoneda | G03F 7/0002 |
| | | | 264/293 |
| 8,211,214 B2* | 7/2012 | Xu | B01D 19/0005 |
| | | | 95/246 |
| 8,349,241 B2 | 1/2013 | Sreenivasan et al. | |
| 9,227,361 B2* | 1/2016 | Choi | G03F 7/0002 |
| 9,381,540 B2* | 7/2016 | Koshiba | B05D 1/322 |
| 9,547,234 B2 | 1/2017 | Koole et al. | |
| 9,636,851 B2* | 5/2017 | Tanabe | G03F 7/0002 |
| 9,694,535 B2* | 7/2017 | Mori | B29C 59/002 |
| 10,197,911 B2* | 2/2019 | Kimura | G03F 7/0002 |
| 10,423,064 B2* | 9/2019 | Narioka | G03F 7/0002 |
| 2007/0138699 A1 | 6/2007 | Wuister et al. | |
| 2007/0275114 A1 | 11/2007 | Cherala et al. | |
| 2008/0303187 A1 | 12/2008 | Stacey et al. | |
| 2010/0096764 A1 | 4/2010 | Lu | |
| 2010/0104852 A1 | 4/2010 | Fletcher et al. | |
| 2010/0270705 A1 | 10/2010 | Okushima et al. | |
| 2011/0140304 A1 | 6/2011 | Choi et al. | |
| 2011/0182805 A1 | 7/2011 | DeSimone et al. | |
| 2013/0320589 A1* | 12/2013 | Fujita | B29C 59/026 |
| | | | 264/293 |
| 2014/0008841 A1 | 1/2014 | Choi et al. | |
| 2014/0199485 A1 | 7/2014 | Schram et al. | |
| 2015/0123312 A1 | 5/2015 | Nakano | |
| 2015/0224536 A1 | 8/2015 | Koshiba et al. | |
| 2019/0062905 A1* | 2/2019 | Sato | C23C 16/042 |
| 2019/0101823 A1* | 4/2019 | Patel | G03F 7/0002 |
| 2019/0235378 A1* | 8/2019 | Fletcher | B29C 59/026 |

* cited by examiner

IMPRINTING METHOD AND APPARATUS

REFERENCE TO RELATED APPLICATION

This patent application claims priority to U.S. Provisional Application Ser. No. 62/565,363 filed Sep. 29, 2017, which is incorporated by reference herein.

BACKGROUND

Field of Art

The present disclosure relates to systems and methods for controlling the flow of gas in a nanoimprint system.

Description of the Related Art

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate such as a semiconductor wafer; therefore nano-fabrication becomes increasingly important. Nano-fabrication provides greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating layers of integrated devices such as CMOS logic, microprocessors, NAND Flash memory, NOR Flash memory, DRAM memory, MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned U.S. patents includes pressing an imprint template onto a formable material. After the imprint is pressed into the formable material, the formable material flows into indents within the imprint template so as to form a pattern. The formable material also flows towards the edges of the template. Any excess formable material may be extruded from the template. After the formable material has filled all of the indents within the imprint template, the formable material is cured. The curing process may also cure the extruded formable material. The cured extruded formable material may stick to the template and cause defects in subsequent impressions. What is needed is a method of preventing this extruded material from being cured or being extruded at all.

SUMMARY

At least a first embodiment, may be an imprint method. The imprint method may comprise applying a plurality of droplets of a formable material to an imprint region of a substrate. Wherein a partial pressure of the formable material develops at a fluid-gas interface of the formable material. The imprint method may comprise bringing a portion of an imprinting surface of a mesa on a template at an initial contact time into contact with the plurality of droplets of the formable material causing the plurality of droplets of the formable material to merge and flow towards an imprint edge interface between a mesa sidewall of the imprinting surface and the substrate. The imprint method may comprise causing a first gas to flow in a first region that includes the imprint region beginning prior to the initial contact time. The imprint method may comprise causing a second gas to flow in a second region that includes the imprint edge interface and at least a portion of a gap region between the template and the substrate after the initial contact time. The template and the flow of the second gas may be configured to reduce the partial pressure of the formable material below a vapor pressure of the formable material in a portion of the gap region adjacent to the fluid-gas interface at the imprint edge interface.

In an aspect of the first embodiment, the second gas may be one of: oxygen, clean dry air, nitrogen, argon, carbon dioxide, and helium. The second gas may be different from the first gas. The first gas may be helium and the second gas may be one of oxygen, clean dry air, nitrogen, argon, and carbon dioxide.

In an aspect of the first embodiment, the first gas may flow into the first region from the edge of the template. The second gas may flow from the edge of the template through the gap region and towards the mesa sidewall. The gap region may be configured to have a thickness that is large enough to not substantially reduce the flow of the second gas from the edge of the template to the mesa sidewall.

In an aspect of the first embodiment, both the first gas and the second gas may flow towards the edge of the template through the same gas nozzles.

In an aspect of the first embodiment, the thickness of the gap region may be greater than or equal to 100 µm.

In an aspect of the first embodiment, the second gas may flow through a plurality of holes in the template into the gap region. The flow of the second gas into the gap region may be configured to circulate gas in and out of the gap region reducing the partial pressure of the formable material below the vapor pressure of the formable material in a portion of the gap region adjacent to the fluid-gas interface at the imprint edge interface.

In an aspect of the first embodiment, the first gas may flow into the first region through the plurality of holes in the template and from the edge of the template.

In an aspect of the first embodiment, the first gas may flow into the first region from the edge of the template.

In an aspect of the first embodiment, the first gas may flow through the plurality of holes in the template.

In an aspect of the first embodiment, the gap region may be bounded by: the mesa sidewall, the substrate, a template face, and an edge of the template face.

In an aspect of the first embodiment, the second gas may flow both in and out of the gap region through the plurality of holes. A positive pressure is applied to one or more of the plurality of holes. A negative pressure is applied to one or more of the plurality of holes. A net pressure of the positive pressure and the negative pressure may be zero or less than zero.

In an aspect of the first embodiment, the net pressure may be a time averaged pressure.

In an aspect of the first embodiment, a flow rate of the second gas may be lower than a flow rate of the first gas.

In an aspect of the first embodiment, the first gas may displace an undesirable gas from the imprint region. The undesirable gas may inhibit polymerization. The second gas is or includes the undesirable gas. The second gas may begin flowing after the formable material has filled regions of interest in the imprint field.

In an aspect of the first embodiment, the second gas may be one of oxygen, clean dry air (CDA), and an oxygen containing mixture.

In an aspect of the first embodiment, the flow of the second gas may begin at or after the initial contact time. The flow of the second gas may be reduced or terminated at a beginning of a feedback based alignment period.

At least a second embodiment, may be an imprinting apparatus controller comprising: a memory; and a processor configured to send instructions to an imprinting apparatus. The processor may send instructions for applying a plurality of droplets of a formable material to an imprint region of a substrate wherein a partial pressure of the formable material develops at a fluid-gas interface of the formable material. The processor may send instructions for bringing a portion of an imprinting surface of a mesa on a template at an initial contact time into contact with the plurality of droplets of the formable material causing the plurality of droplets of the formable material to merge and flow towards an imprint edge interface between a mesa sidewall of the imprinting surface and the substrate. The processor may send instructions for causing a first gas to flow in a first region that includes the imprint region beginning prior to the initial contact time. The processor may send instructions for causing a second gas to flow in a second region that includes the imprint edge interface and at least a portion of a gap region between the template and the substrate after the initial contact time. The template and the flow of the second gas may be configured to reduce the partial pressure of the formable material below a vapor pressure of the formable material in a portion of the gap region adjacent to the fluid-gas interface at the imprint edge interface.

At least a third embodiment, may be a method of manufacturing an article. The manufacturing method may comprise patterning a substrate. Patterning the substrate may comprise applying a plurality of droplets of a formable material to an imprint region of a substrate. Wherein a partial pressure of the formable material develops at a fluid-gas interface of the formable material. Patterning the substrate may further comprise bringing a portion of an imprinting surface of a mesa on a template at an initial contact time into contact with the plurality of droplets of the formable material causing the plurality of droplets of the formable material to merge and flow towards an imprint edge interface between a mesa sidewall of the imprinting surface and the substrate. Patterning the substrate may further comprise causing a first gas to flow in a first region that includes the imprint region beginning prior to the initial contact time. Patterning the substrate may further comprise causing a second gas to flow in a second region that includes the imprint edge interface and at least a portion of a gap region between the template and the substrate after the initial contact time. The template and the flow of the second gas may be configured to reduce the partial pressure of the formable material below a vapor pressure of the formable material in a portion of the gap region adjacent to the fluid-gas interface at the imprint edge interface. The manufacturing method may further comprise performing additional processing on the substrate so as to manufacture the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

Figure 1:
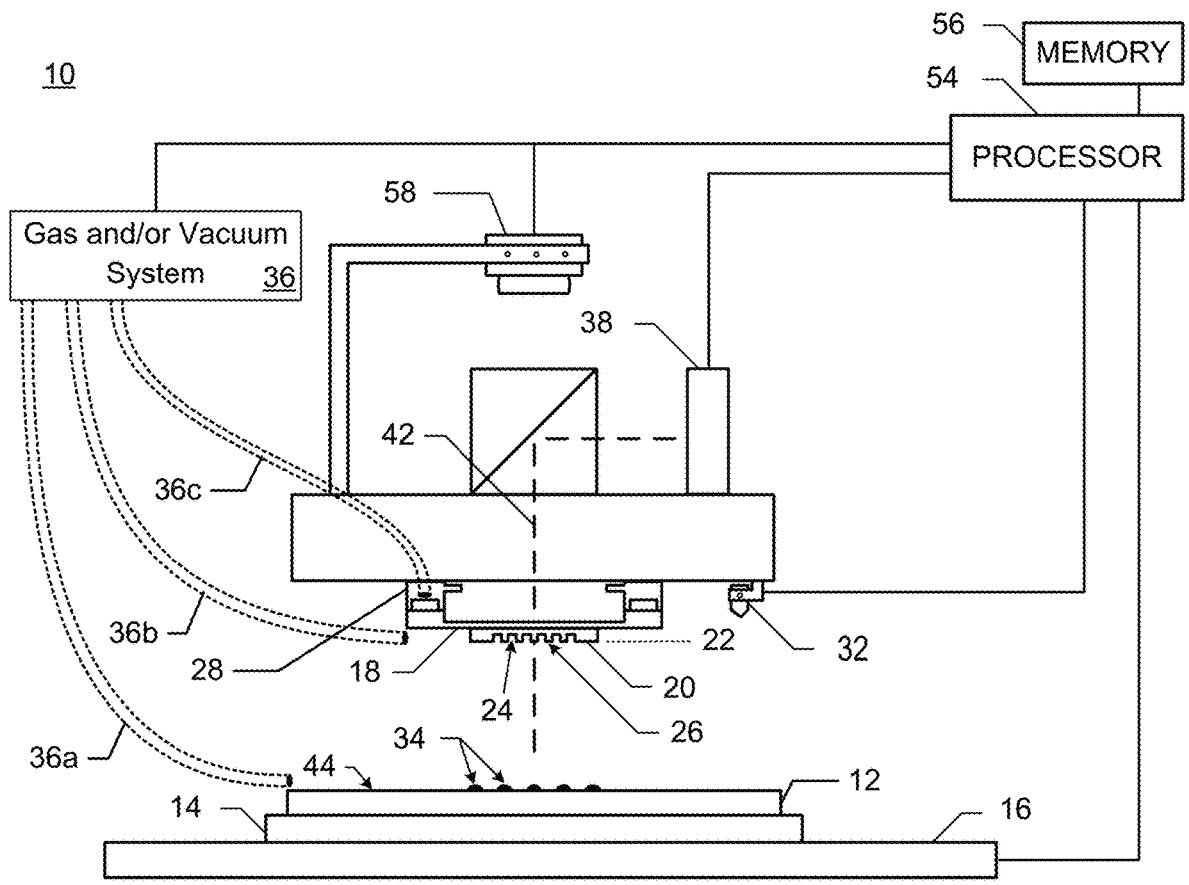
FIG. 1 is an illustration of a nanoimprint lithography system having a template and a mold spaced apart from a substrate.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

What is needed is a way to effectively reduce extrusions.

First Embodiment

FIG. 1 is an illustration of a nanoimprint lithography system 10 in which an embodiment may be implemented. The nanoimprint lithography system 10 is used to form a relief pattern on a substrate 12. The substrate 12 may be a planar surface such as a semiconductor wafer. Substrate 12 may be coupled to a substrate chuck 14. Substrate chuck 14 may be but is not limited to a vacuum chuck, pin-type, groove-type, electrostatic, electromagnetic, and/or the like.

Substrate 12 and substrate chuck 14 may be further supported by a positioning stage 16. Stage 16 may provide translational and/or rotational motion along one or more of the x, y, z, θ, and φ axes. Stage 16, substrate 12, and substrate chuck 14 may also be positioned on a base (not shown).

Spaced-apart from the substrate 12 is a template 18. Template 18 may include a body having a first side and a second side with one side having a mesa 20 extending towards the substrate 12. Mesa 20 may have a patterning surface 22 (also referred to as an imprinting surface or imprint surface). Mesa 20 may also be referred to as mold 20.

Template 18 and/or mold 20 may be formed from such materials including, but not limited to: fused-silica, quartz, silicon, organic polymers, siloxane polymers, borosilicate glass, fluorocarbon polymers, metal, hardened sapphire, and/or the like. The patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on the substrate 12. The spaced-apart recesses 24 and/or protrusions 26 may be spread across the entire patterning surface 22 or just an imprint region of the patterning surface 22. The imprint region may be that region which is intended to be patterned and filled with formable material 34.

Template 18 may be coupled to a template chuck 28. The template chuck 28 may be, but not limited to, vacuum, pin-type, groove-type, electrostatic, electromagnetic, and/or other similar chuck types. Further, template chuck 28 may be coupled to an imprint head which in turn may be moveably coupled to a bridge such that the template chuck 28, the imprint head, and the template 18 are moveable in at least the z-axis direction, and potentially other directions and/or angles.

Nanoimprint lithography system 10 may further comprise a fluid dispensing system 32. Fluid dispensing system 32 may be used to deposit formable material 34 (e.g., polymerizable material) on a substrate 12 as a plurality of droplets of the formable material. Additional formable material 34 may also be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. For example, formable material 34 may comprise a monomer mixture as described in U.S. Pat. Nos. 7,157,036 and 8,076,386, both of which are herein incorporated by reference.

The nanoimprint lithography system 10 may include an imprint field atmosphere control system such as gas and/or vacuum system 36 that is in communication with a processor 54 an example of which is described in U.S. Patent Publication No. 2010/0096764 which is hereby incorporated by reference. The gas and/or vacuum system 36 may include one or more of pumps, valves, solenoids, gas sources, gas tubing, etc. which are configured to cause gas to flow at different times and different regions. The gas and/or vacuum system 36 may be connected to a gas transport system 36a that transports gas to and from the edge of the substrate 12 and controls the imprint field atmosphere by controlling the flow of gas at the edge of the substrate 12. The gas and/or vacuum system 36 may be connected to a gas transport system 36b that transports gas to and from the edge of the template 18 and controls the imprint field atmosphere by controlling the flow of gas at the edge of the template 18. The gas and/or vacuum system 36 may be connected to a gas transport system 36c that transports gas to and from the top of the template 18 and controls the imprint field atmosphere by controlling the flow of gas through the template 18. One, two, or three of the gas transport systems 36a, 36b, and 36c may be used in combination to control the flow of gas in and around the imprint field.

A fluid-gas interface forms at the boundary of the formable material 34 and the imprint field atmosphere. Depending upon the temperature and imprint field atmosphere some portion of the formable material 34 evaporates and a partial pressure of the formable material develops at the fluid-gas interface of the formable material. The upper limit for this partial pressure is the vapor pressure (the saturation pressure) of the formable material which is temperature dependent. As the partial pressure of the formable material approaches the vapor pressure of the formable material the net evaporation rate slows down until it eventually stops when the partial pressure is equal to the vapor pressure.

The nanoimprint lithography system 10 may further comprise an energy source 38 that directs energy along path 42. Imprint head and stage 16 may be configured to position template 18 and substrate 12 in superimposition with path 42. Camera 58 may likewise be positioned in superimposition with path 42. The nanoimprint lithography system 10 may be regulated by processor 54 in communication with stage 16, imprint head, fluid dispensing system 32, source 38, and/or camera 58 and may operate on a computer readable program stored in non-transitory computer readable memory 56.

Either imprint head, stage 16, or both vary a distance between mold 20 and substrate 12 to define a desired volume that is filled by the formable material 34. For example, imprint head may apply a force to template 18 such that mold 20 contacts formable material 34. After the desired volume is filled with formable material 34, source 38 produces energy, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having an imprint thickness $h_1$ and residual layer having a residual layer thickness $h_2$ as illustrated in FIG. 2.

Figure 2:
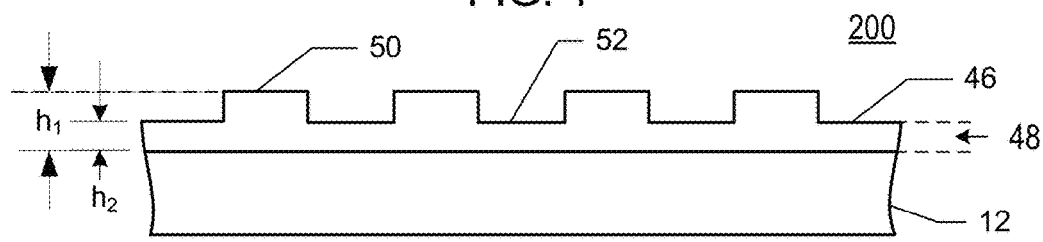
FIG. 2 is an illustration of a substrate with a solidified patterned layer formed upon it.
Figure 3A:
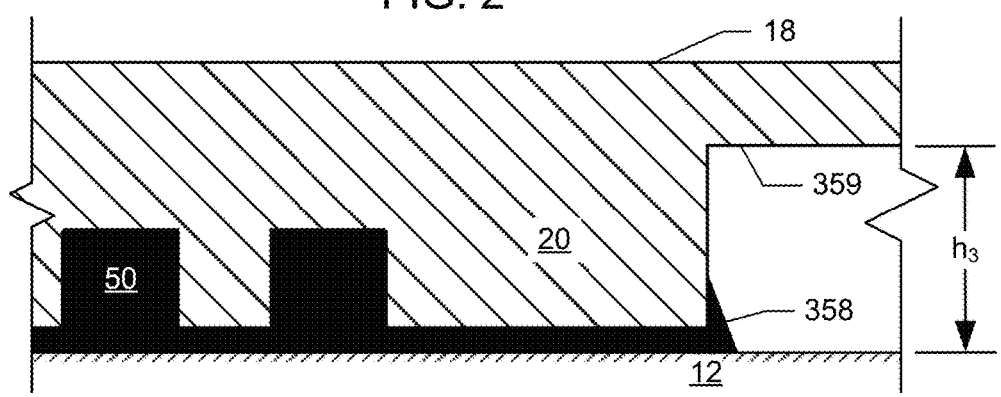
FIGS. 3A-C are illustrations of: a substrate; a template; a non-solidified formable material; and extruded formable material.
Figure 3B:
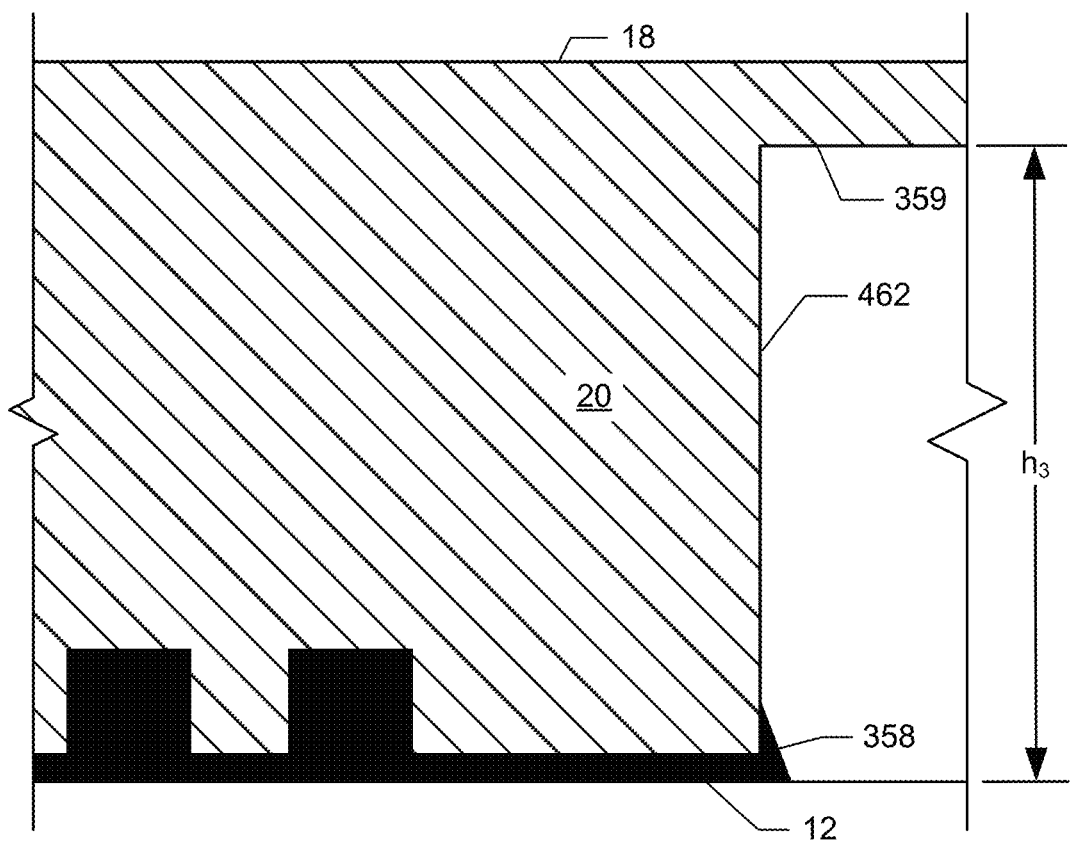
Figure 3C:
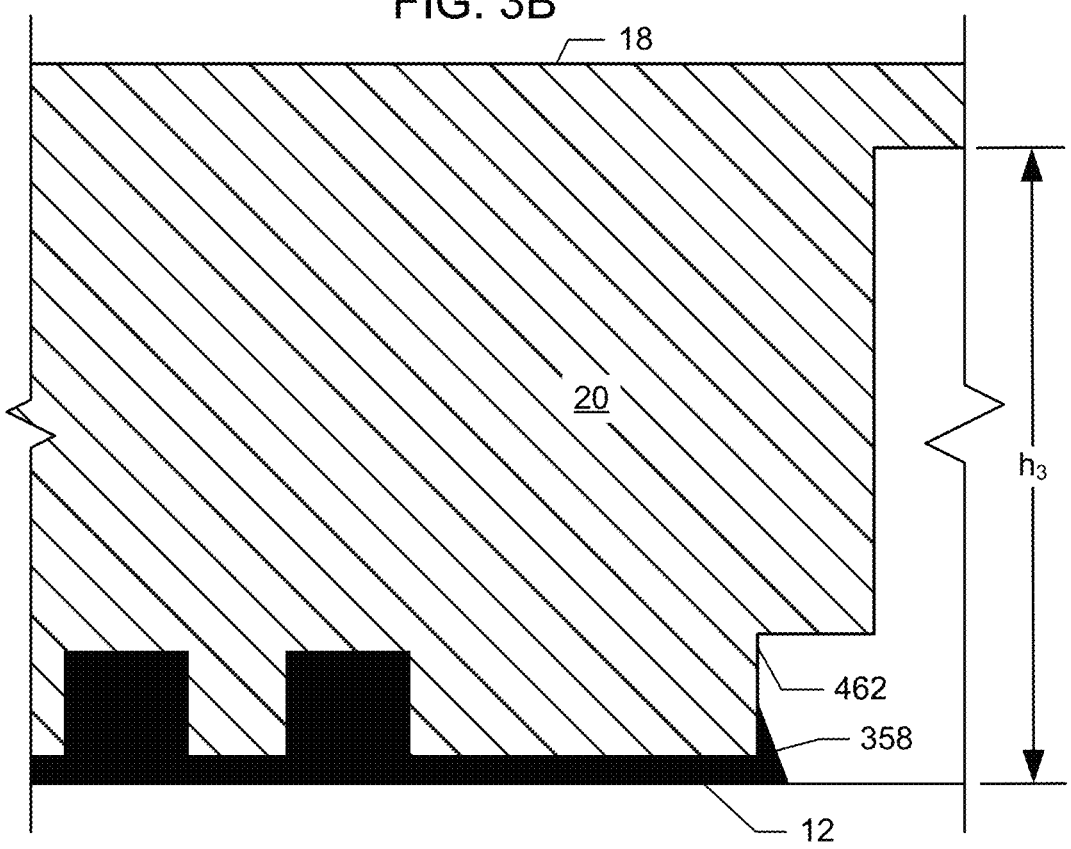

FIGS. 3A-C are illustrations of how template 20 may be used to create the patterned layer 46 in FIG. 2. The template 18 is brought into contact with the formable material 34. As pressure is applied to the template 18 the formable material 34 extrudes beyond the imprint area. The formable material 34 may climb up the mesa sidewall and solidify after UV cure to form an extrusion defect 358. Following separation, the extrusion defect 358 adheres to the template 18 or the substrate 12. In either case, the extrusion can lead to a variety of imprint and post-imprint defects which can affect yield and/or template life. Extrusion defects 358 can accumulate on the template 20 and may fall off during subsequent imprints. Extrusion defects 358 can also break away from the substrate 12 during separation of the template 12 from the substrate 12, and land on a different area of the substrate 12. Extrusion defects may impact later processes such as the uniformity of a spin coating and/or may affect a later etching process.

After the mesa 20 contacts the formable material 34, the formable material can extrude outside the mesa area and climb up the mesa sidewall as illustrated in FIGS. 3A-C. There is a small gap with a gap height of $h_3$ between the substrate 12 and the template face 359 of the region of the template outside of the mesa 20 as illustrated in FIG. 3A. The gap height $h_3$ may be on the order of 30 μm. Due to the narrowness of the gap, the formable material vapor can quickly saturate the area around the mesa sidewall reaching its vapor pressure throughout a gap region under the template. This could occur as early as initial contact of the mesa with the formable material 34. The formable material 34 at the edge of the mesa is in equilibrium with the partial pressure of formable material vapor in the small gap region near the mesa edge, thus further evaporation of the formable material 34 from the mesa sidewall is inhibited. When the gap height $h_3$ is small there is high resistance to the flow of gas within the gap region from outside the gap region. The applicant has found that when the gap region has a short height (on the order of 30 μm) it also has a high resistance to the flow gas from the outside edge of the template to the mesa sidewall 462. The applicant has found reducing the distance from template edge to the mesa sidewall 462 reduces this resistance. The applicant has also found that increasing the height of the gap region reduces resistance.

Figure 4:
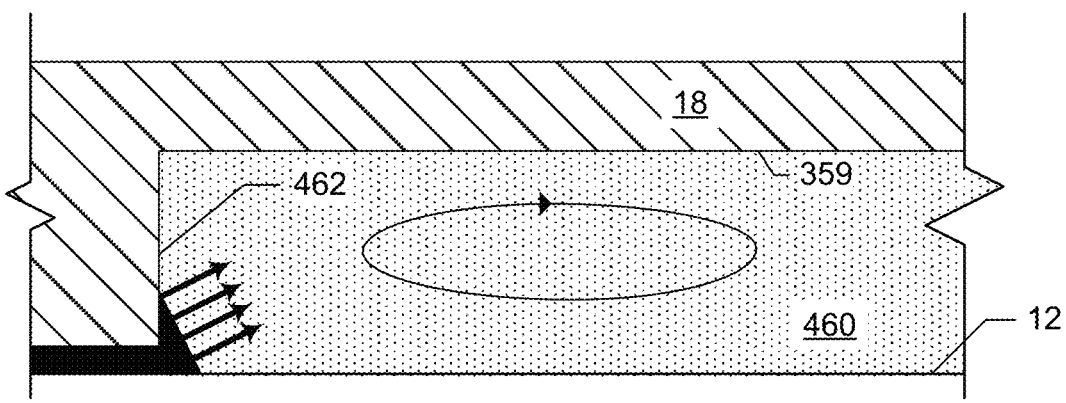
FIG. 4 is an illustration of: a substrate; a template; non-solidified formable material; extruded formable material, and a gap region with vapor.

The applicants have found, as illustrated in FIG. 4, that creating a gas flow in the gap region 460 with either positive and/or negative pressure reduces the partial pressure of the formable material vapor within the gap region 460 and at or near the mesa sidewall 462. The gap region 460 may bounded by the substrate 12, the mesa sidewall 462, the template face 359, and the template edge. The applicants have found that reducing the partial pressure of the formable material vapor enables evaporation of the formable material 34 that may have or will adhere to the mesa sidewall 462. The evaporation rate at the mesa sidewall 462 depends on numerous factors such as the gas flow, the vapor pressure of the formable material 34, and the surface area to volume ratio of the formable material 34 on the mesa sidewall 462. An imprint edge interface may be the region of the residual layer bounded by an edge of the mesa sidewall 462 and the substrate 12 when the residual layer extends to edge of the mesa and beyond. In the case where the formable material does not extend the edge of the mesa the imprint edge interface is that portion of the residual layer outside the imprint region which is in contact with the atmosphere of the gap region 460.

If there is little to no formable material 34 on the mesa sidewall 462, then there will be little to no extrusion 358 created following curing and separation. In addition, the flow of gas helps to reduce the partial pressure of the formable material vapor in the entire template 18 area. If the partial pressure of the formable material vapor is reduced, deposition of formable material vapor on the template 18 is prevented and/or substantially limited. When vacuum is used to provide gas flow, formable material vapor can be removed from the processing chamber volume to keep the tool clean. By circulating gas at the mesa edge, extrusions can be reduced or eliminated completely and the chance of formable material vapor adhering to the template 18 can be reduced. This can lead to less defects and help to increase the template 18 life since it will not have to be cleaned as frequently. The partial pressure of the formable material vapor is saturated at the imprint edge interface. The partial pressure decreases slightly from the imprint edge interface to the template edge, and once outside the gap region it quickly reduces to zero. By flowing gas which does not include formable material vapor in or just near a portion of the gap region adjacent to the fluid-gas interface at the imprint edge interface, a region in which the partial pressure of the formable material has saturated to the vapor pressure, the partial pressure of the formable material can be reduced and formable material vapor will diffuse from the saturated region to the newly unsaturated region. This enables further evaporation of the formable material at the imprint edge interface, and thus reduces or eliminates extrusions 358 from occurring.

Figure 5A:
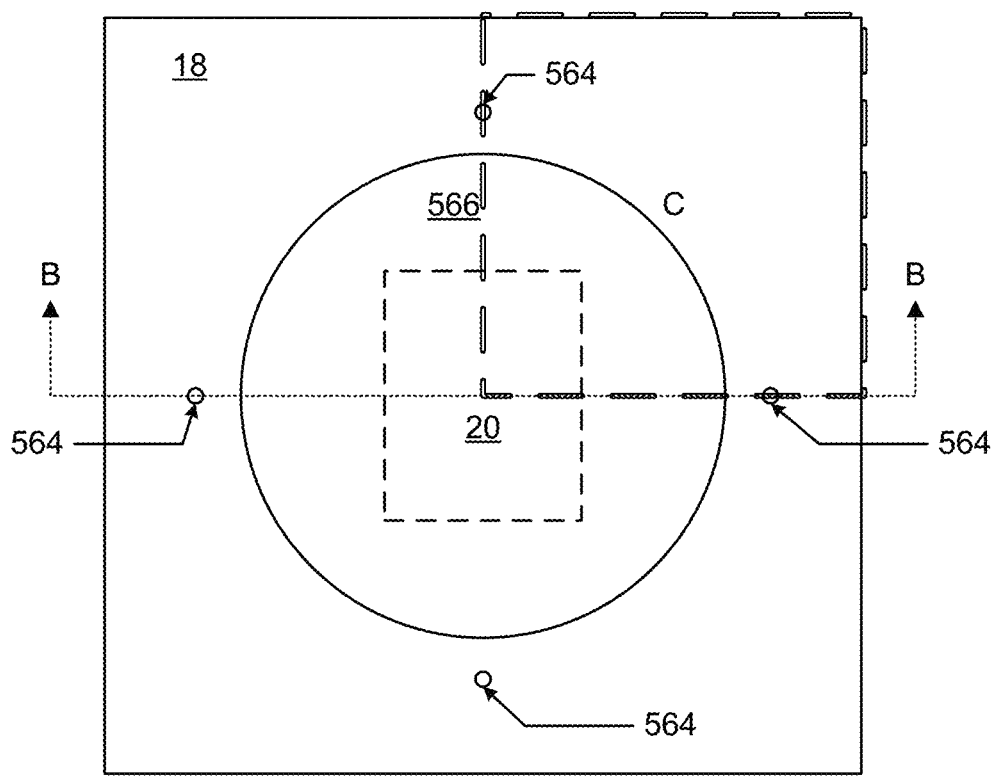
FIGS. 5A-F are illustrations of an exemplary template that may be used in an embodiment.

FIG. 5A is an illustration of a template 18 that might be used in a first embodiment an example which is described in U.S. Pat. No. 9,227,361 which is hereby incorporated by reference. The template 18 may include a plurality of holes 564 which are connected to gas transport system 36c. The holes 564 may be machined through the template 18 in a region that is outside the core-out area 566. The holes 564 refer to any opening which allows gas to pass through the template 18, and does not necessarily reference an opening with a well-defined diameter, as other geometries which accomplish the task of allowing gas into the gap region 460 also meet this criteria in the context of this embodiment.

Figure 5B:
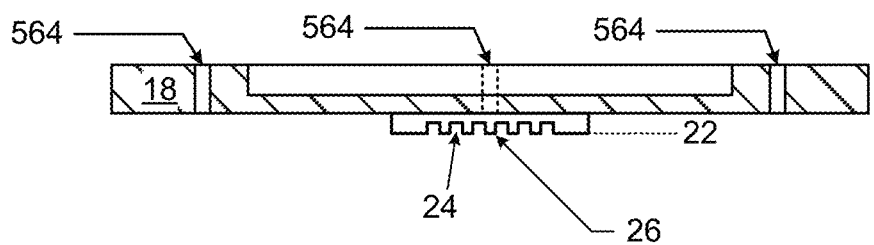
Figure 5C:
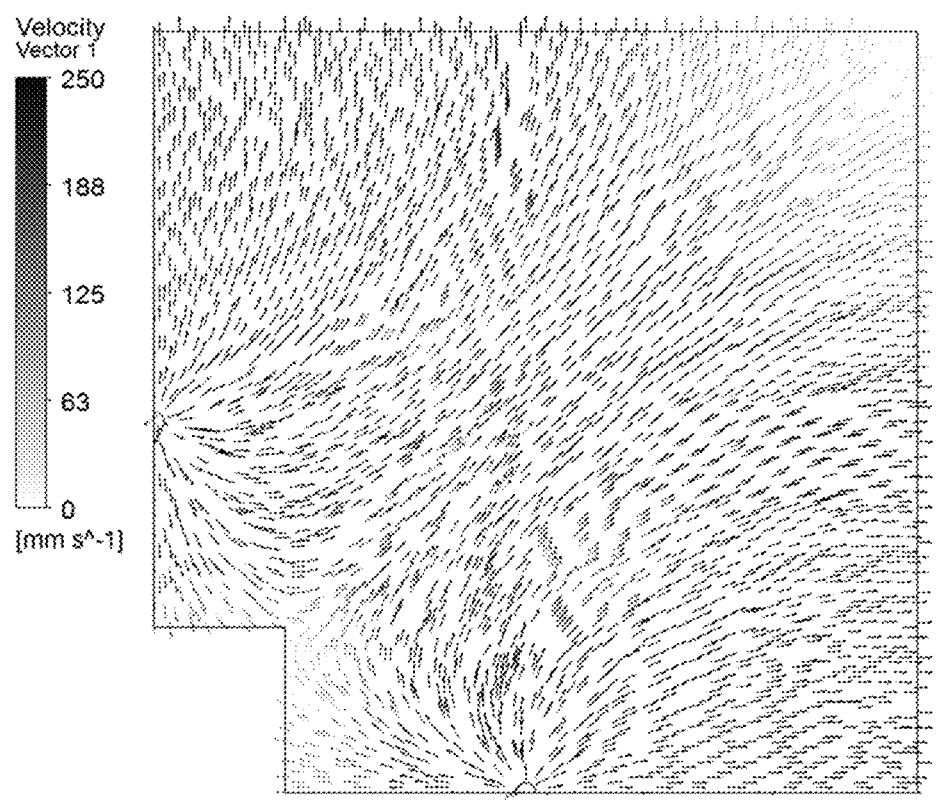

As illustrated in FIG. 5A, the holes 564 may be located adjacent to the core out area 566 up to 40 mm from the edge of the core out area 566. In an alternative embodiment, the holes 564 may be located in the core out area 566. An alternative embodiment, does not include the core out area 566 and the holes 564 are located adjacent to the mesa 20, near the template edge, or anywhere in between. As illustrated in FIG. 5A the template 18 may include 4 holes 564. An alternative embodiment, may include additional holes 564 for example the template 18 may include 2, 4, 8, 16, or 32 holes. FIG. 5B is a cross section view of the template 18 which shows the holes passing through the template 18 along line B-B. FIG. 5B shows 2 holes 564 on the sides of the template 18 and one hole 564 (dashed lines) behind the core out area of the template 18. FIG. 5C is a numerical simulation of a region C illustrated in FIG. 5A showing the velocity of the gas above the substrate 12, in which the height $h_3$ of the gap is 30 µm, gas flows through holes 564 at 0.05 slpm (standard liter per minute). In FIG. 5C the velocity is shown 15 µm above the substrate 12.

As illustrated in FIG. 5A, the holes 564 may be located on lines of symmetry with respect to the mesa 20. In an alternative embodiment, the holes 564 are located at other locations such as the corners of the mesa 20. In one embodiment, the holes 564 may be located ~1 mm outside the core out area 566 or as close to the core out area 566 without compromising the structural integrity of the template 18.

The purpose of the holes 564 is to provide a conduit through which gas can be transported through the body of the template 18 and into the gap region 460 and/or the mesa sidewall 462, and gas flow can be obtained by creating a pressure differential across the body of the template 18. For example, if a gas is pressurized upstream of the hole, then gas will flow towards the substrate 12 into the gap between the template 18 and substrate 12. If the pressure is reduced upstream of the template 18 by applying a vacuum, then gas in the gap will flow towards the hole. U.S. Pat. No. 7,462,028 describes an example of a template with holes in which a partial vacuum is applied so as to lower the pressure in the active area which is hereby incorporated by reference. In one embodiment, both positive and negative pressure (relative to ambient) is applied to the holes 564. One hole may be operating at positive pressure, while another hole is operating at a reduced pressure or a negative pressure (relative to ambient).

In one embodiment, gas flow is controlled individually at each hole with a processor 54 that may communicate with one or more of: a mass flow controller; a pressure sensor; a pressure regulator, a solenoid valve, and other methods for controlling the flow of gas that are incorporated into the gas and/or vacuum system 36. The gas that passes through the holes 564 may be conditioned for the imprint process by the use of one or more of a desiccant, a filter, a purifier, and a temperature control system.

Second Embodiment

Figure 5D:
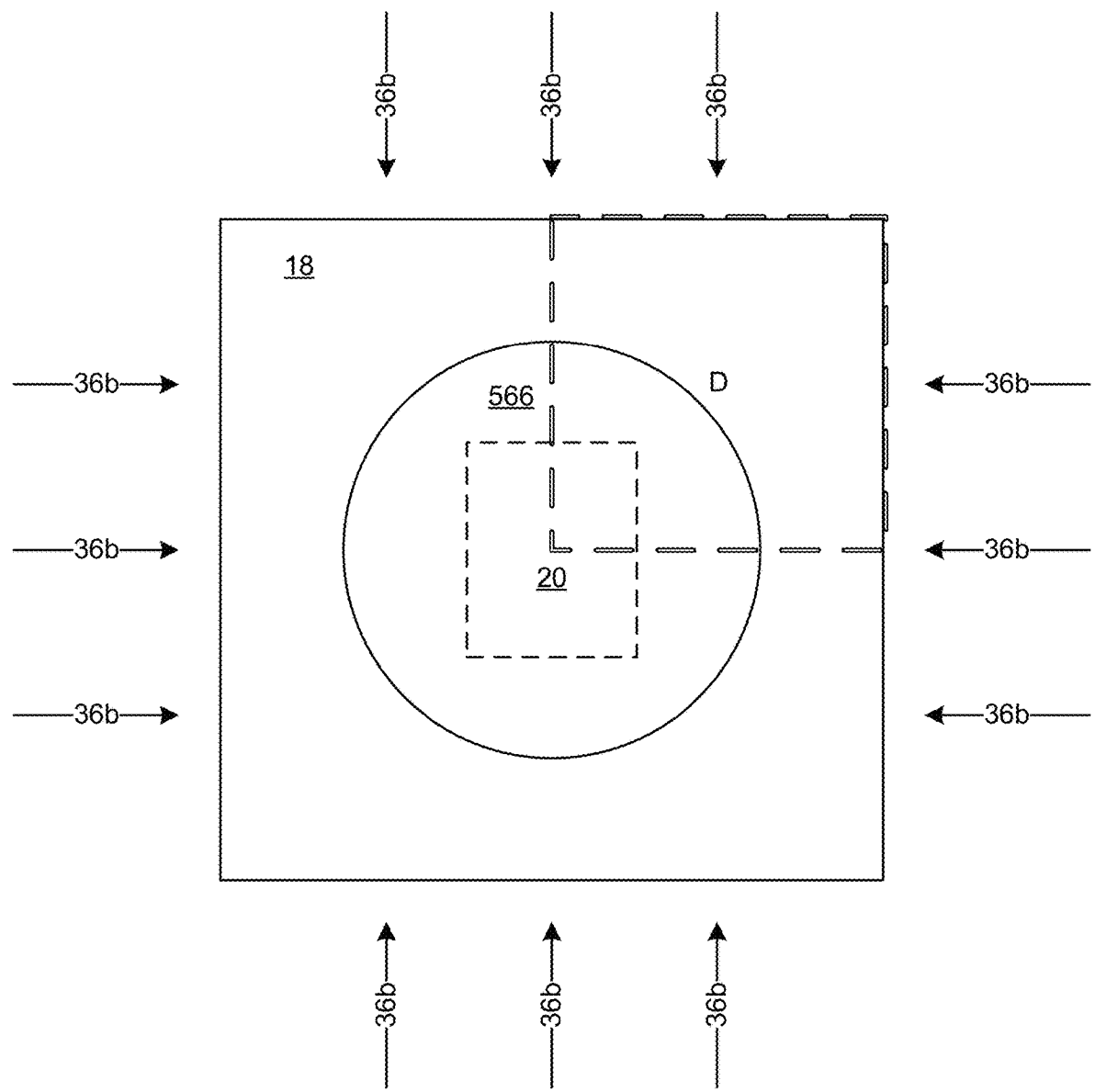
Figure 5E:
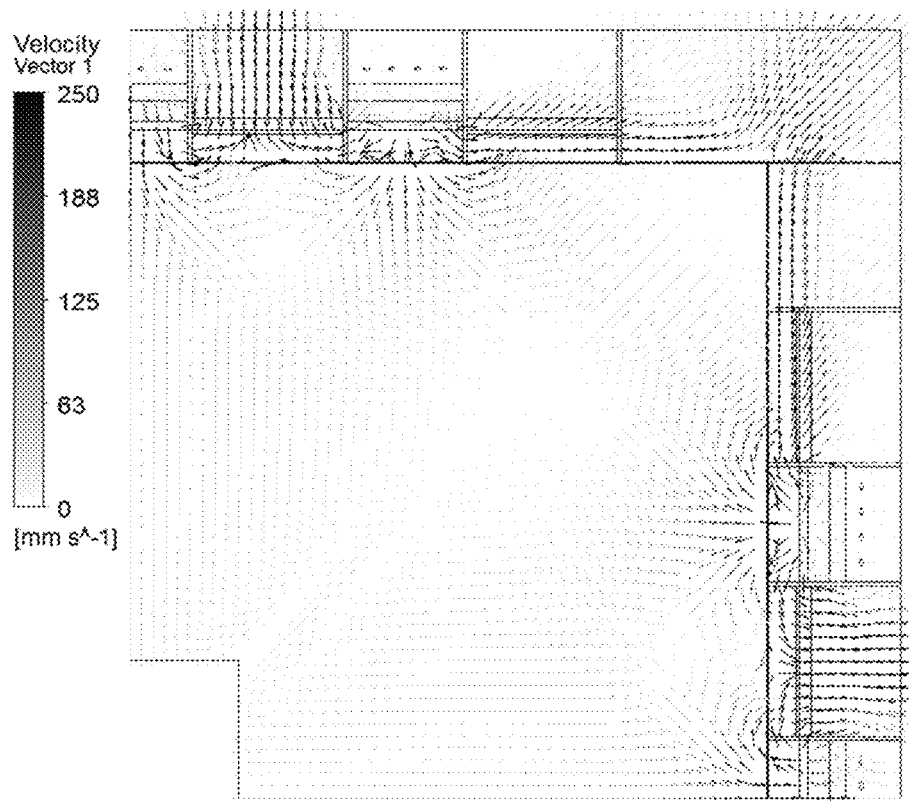
Figure 5F:
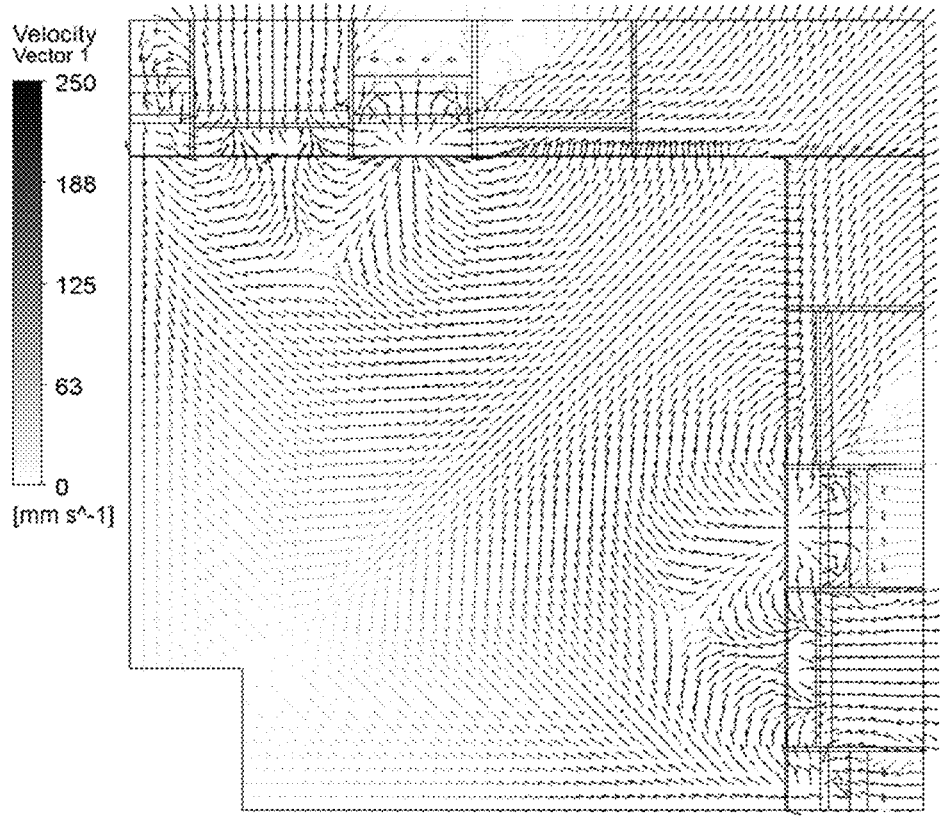

A second embodiment, may make use of other template designs. For example one template design may include a deep etch mesa which has a gap height $h_3$ as illustrated in FIG. 3B that is greater than 30 µm and may be on the order of 100 µm or greater. This increase in the gap height $h_3$ increases the volume of the gap region 460 illustrated in FIG. 4 relative to the exposed surface area of any extruded material 358. For a given vapor pressure of formable material, this increase in volume allows for a proportional larger volume of formable material to evaporate from the mesa edge. Another template design may include a double edge mesa as illustrated in FIG. 3C that includes an indented sidewall 462. In yet another template design the mesa sidewall may be curved or angled so as to aid in the reduction of extrusions. A larger gap (e.g. 100 µm) between the template 18 and substrate 12 reduces the resistance to gas flow between the template 18 and substrate 12. Reducing the length from the outside of the template 18 to the mesa sidewall 462 also reduces the resistance. Gas flowing from gas transport system 36b may also be introduced from outside the template 18 area using nozzles directed at the gap. Any number of nozzles positioned around the template 18 (e.g. 4 or 20 nozzles) can be directed towards the mesa sidewall. For example, FIG. 5D illustrates an embodiment which includes 12 nozzles. Nozzles may be positioned so that gas flow is directed substantially towards the mesa sidewall. Nozzles may also be positioned at an angle relative to the template 18 and use the substrate 12 surface to redirect the gas flow towards the mesa sidewall. Nozzles receiving gas from gas transport system 36c may be positioned around the substrate 12 such that gas flow is deflected off the template 18 and directed towards the mesa sidewall. Positive or negative pressure applied to the nozzles, or combinations thereof, can be used to develop a gas flow between the template 18 and substrate 12. FIGS. 5E-F are numerical simulations of a region D illustrated in FIG. 5D showing the velocity of the gas above the substrate 12, gas flows through nozzles 36b at 15 slpm per side. In FIGS. 5E-F the velocity is shown mid-plane within the gap above the substrate 12. In FIG. 5E the height $h_3$ of the gap is 30 µm. While in FIG. 5F the height $h_3$ of the gap is 250 µm. Please note that velocity of in the gap region surrounding the mesa is much higher in the 250 µm case than in 30 µm case.

The rate and duration of gas flow can impact the rate at which formable material 34 evaporation occurs on the mesa sidewall 462. In an embodiment in which the gas flows through holes 564 the rate of gas flow can range from 0.001 slpm to 1 slpm. In an embodiment in which the gas flows along the template edge as illustrated in FIG. 5D the rate of gas flow can range from 1 slpm to 100 slpm. The lower limit on the gas flow is determined by the vapor pressure of the formable material and the geometry of the template 18 and is dependent upon the gas flow's ability to reduce the partial pressure of the formable material. The upper limit of the gas flow is determined by the stability of the template 18 and the ability of the template 18 to resist moving in response to the gas flow. The duration of flow can range from 0.005 sec (seconds) to 5 sec. In another embodiment, the duration of the flow is more than 5 sec. As an example, the gas flow rate may be 0.03 slpm for a time of 0.5 sec to evaporate formable material at the mesa sidewall. As an another example, the gas flow rate may be 0.005 slpm for a time of 0.5 sec to evaporate formable material at the mesa sidewall. The gas flow rate and duration of flow may be based on the size of the extrusion that would be formed in the absence of gas flow. The higher the gas flow the more the extruded material can be limited. In an embodiment, the flow of gas may be set such that partial pressure of the formable material is reduced to 1%, 10%, 20%, 50%, 70% or 90% of the vapor pressure of the formable material. The lower the partial pressure of the formable material the less time that gas needs to flow so as to ensure that no formable material is extruded. The gas should stop flowing or gas flow should be reduced before too much of the formable material is evaporated or poisoned.

In one embodiment gas flow is introduced at the same time as initial contact of the mesa 20 is made with the formable material 34. In one embodiment the gas flow is turned off after the mesa 20 has come into full contact with the formable material 34. In one embodiment the gas flow is turned off during the fluid fill time. In one embodiment, the gas flow is turned off at the end of the fluid fill period. In one embodiment, the gas flow is turned off during the UV cure. In one embodiment, the gas flow is turned off at the end of UV cure.

In an embodiment, the type of gas used to evaporate the formable material 34, which may be considered an extrusion control gas may include one or more of: clean dry air (CDA); nitrogen; oxygen; carbon dioxide; argon; and helium. The gas may be a pure gas, a combination of different gases, or different gases used in series. The temperature of the gas may be regulated beyond room temperature (20° C.-25° C.). In an embodiment, the temperature of the gas is increased to 100° C. so as to increase the rate at which the formable material 34 is evaporated.

Third Embodiment

In the third embodiment, the gas is a curing inhibitor such as oxygen or an oxygen containing mixture, and the timing at which the gas is flown and gas flow rate is such that gas only diffuses into the extruded formable material 358 and does not substantially diffuse under the imprint area. For example the formable materials may become poisoned when oxygen is present. Oxygen may be a radical polymerization inhibitor by reacting with radicals within the formable material. With the radical count lowered, chain propagation during UV cure may be reduced to the point that extruded material does not polymerize. A constant supply of oxygen may prevent the formable material 34 from curing. The poisoned formable material remains a liquid following UV cure because it does not form a hardened extrusion because chain propagation is inhibited. The poisoned formable material will also continue to evaporate from the mesa sidewall. In this embodiment, the flow of oxygen or oxygen containing mixture must be timed carefully such that the mesa 20 has come into full contact with the formable material 34, so that formable material under the imprint area does not become poisoned.

In an embodiment, the method of gas delivery and gas flow is dependent upon the location of the imprint field on the substrate 12. For example, for an imprint field, in which there is no substrate 12 under a portion of the template 18 therefore there is no gap region 460 in that portion. In which case, one or more of the holes 564 may not be effective at flowing gas towards the mesa sidewall 462. In which case, an external nozzle may be positioned to point gas at the intersection of the mesa with the edge of the substrate.

In a first exemplary embodiment, helium is flown at a rate of ~0.03 slpm to each of four holes 564. The gas flow is started 0.1 sec after the mesa 20 is in full contact with the formable material 34 for a duration of 0.5 sec. In another exemplary embodiment, helium is flown at a rate of ~0.005 slpm to each of four holes 564.

In a second exemplary embodiment, CDA is flown through two holes 564 and vacuum is applied through two other holes 564. The holes 564 providing CDA may be on opposite sides of the mesa 20. The holes 564 providing vacuum may also be on opposite sides of the mesa 20. Each hole 564 may be on a different side of the mesa 20. The holes 564 may be positioned such that the CDA flows in a circular manner around the mesa. The gas flow may be started 0.1 sec after initial contact for a duration of 0.2 sec.

In a third exemplary embodiment, CDA is flown through nozzles located outside the mesa area 20 directed towards the mesa sidewall 462. Using a deep etch mesa template 18 in $h_3$ is greater than 100 μm, CDA is blown through 20 nozzles (5 on each side of the mesa 20) after the mesa 20 is in full contact with the formable material 34 at a sufficient rate so as to reduce the formable material partial pressure at the mesa sidewall. The nozzles may be kept on until after UV cure at which point they may be turned off.

Figure 6A:
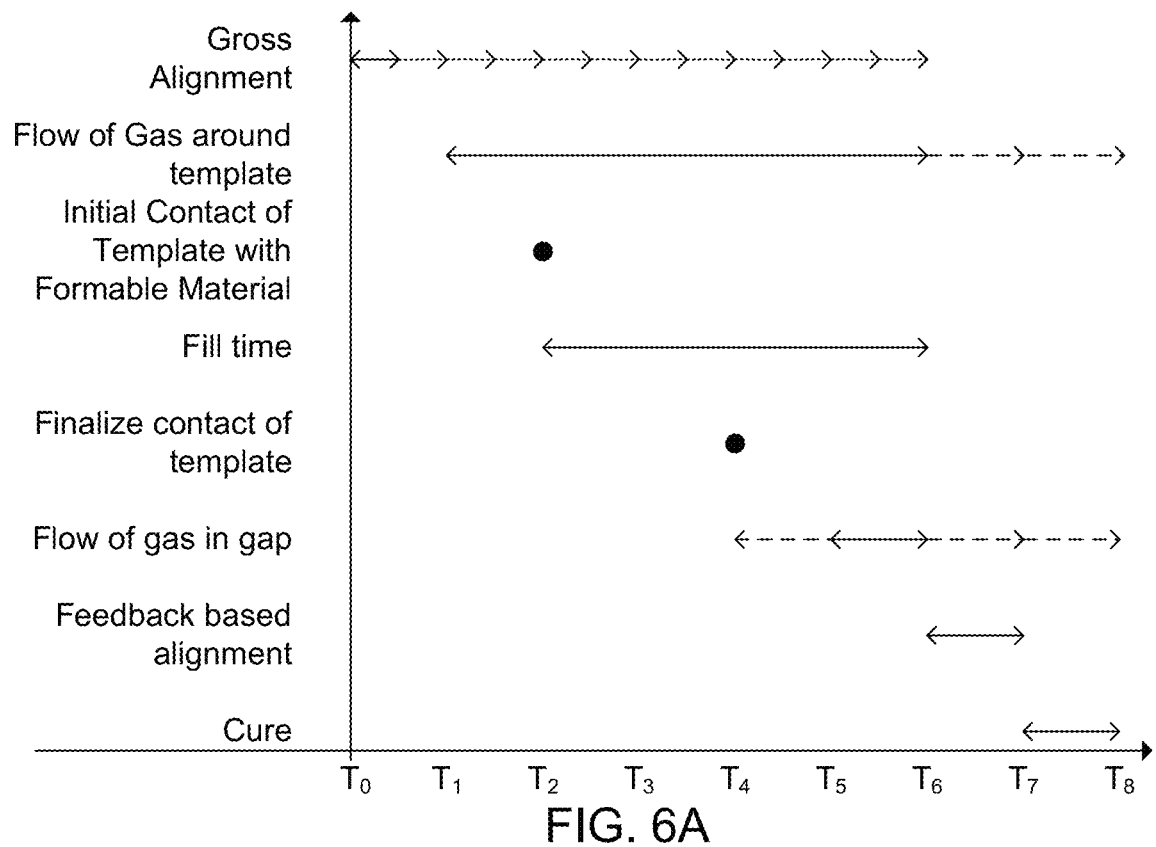
FIGS. 6A-C are illustrations of timing diagrams.
Figure 6B:
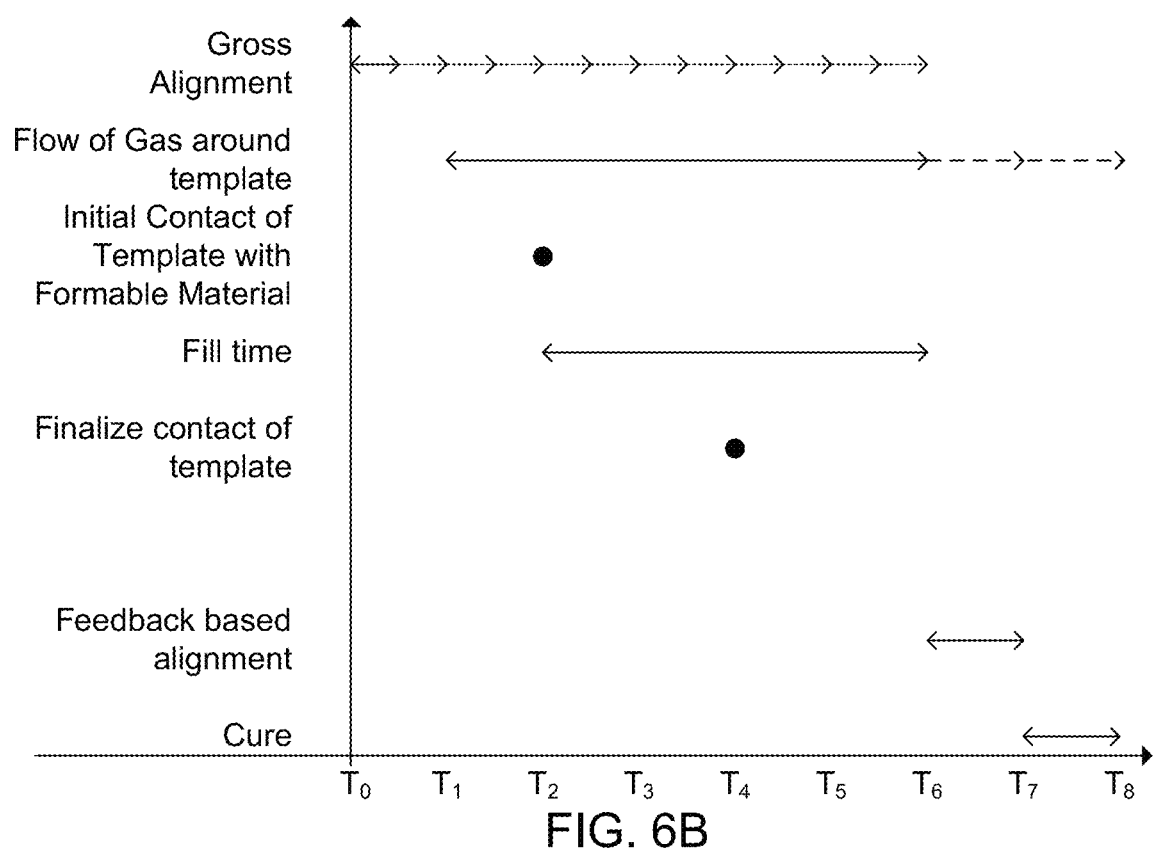
Figure 6C:
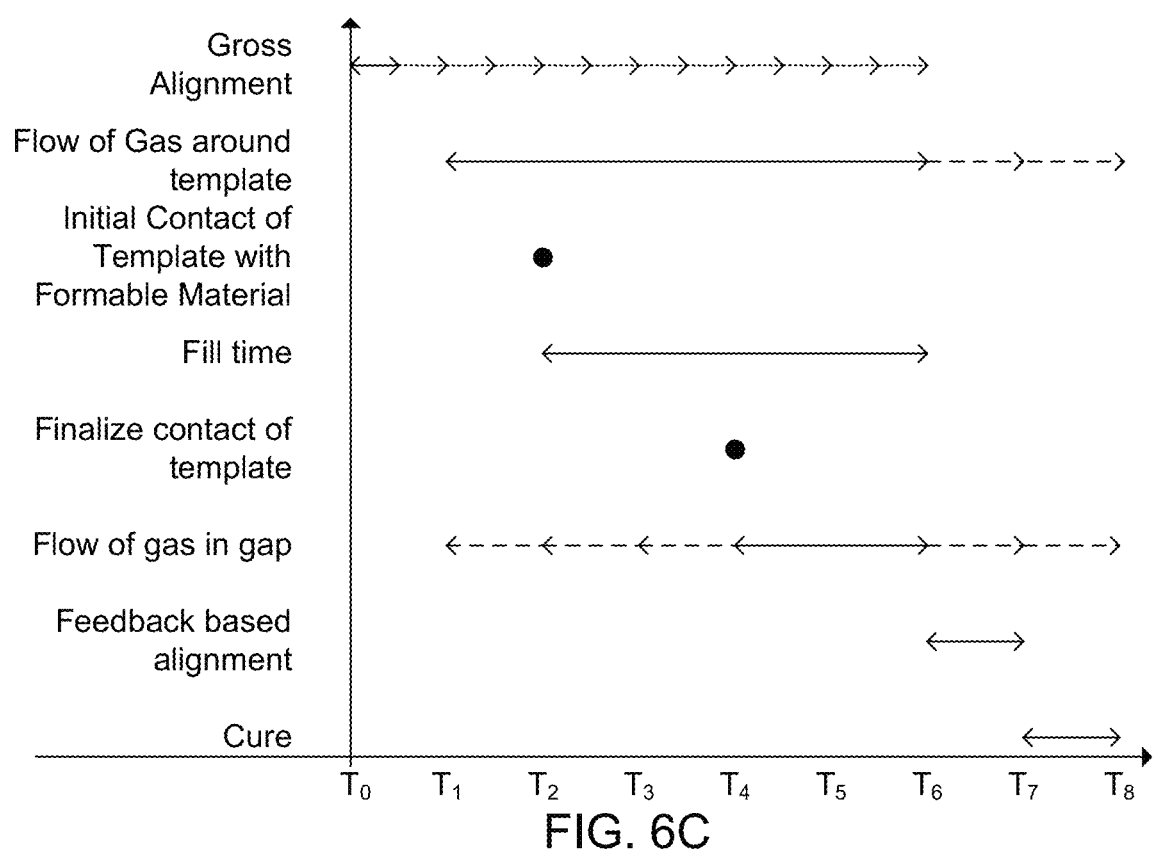

FIGS. 6A-C are illustrations of the timing and arrangement of various steps in the imprinting process which include but are not limited to: gross alignment; flowing gas (such as helium) in the imprint area to displace large molecules such as oxygen; initial contact of template with the formable material; fill time in which the formable material spreads out and is extruded; final contact of the template with formable material; flowing gas to evaporate or poison the extruded material; feedback based alignment; and cure.

Figure 7A:
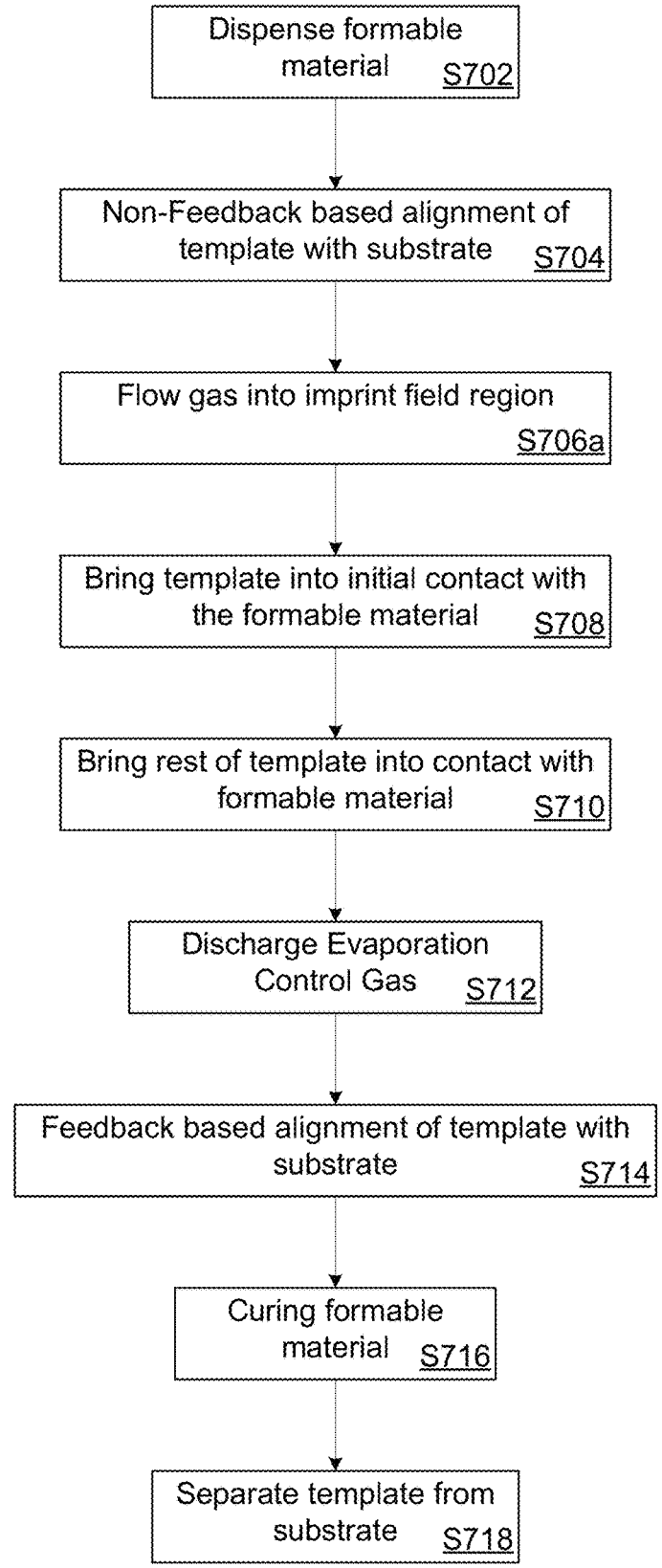
FIGS. 7A-C are illustrations of imprinting processes.

FIG. 7A is an illustration of an imprint process 700a. A first step S702 may include dispensing formable material 34 onto an imprint field of the substrate 12 prior to time $T_0$ as illustrated in FIG. 6A. The template 18 may then be brought into the general area of the imprint field in a non-feedback based process based on prior positioning information in a gross alignment process at step S704 starting at time $T_0$ as illustrated in FIG. 6A. The gross alignment process may continue while other steps in the process are initiated. The gross alignment process may terminate at a time $T_6$ as illustrated in FIG. 6A in which the feedback based alignment of step S712 is started, or at any time prior to time $T_6$.

In a step S706a, a displacement gas flows into the imprint field region beginning at a time $T_1$ as illustrated in FIG. 6A by flowing the displacement gas around the template 18 via the gas transport systems 36a and/or 36b. In an embodiment, the displacement gas is helium. The displacement gas is a gas that does not interfere with the filling of indentions and other features of the template and displaces oxygen and/or other large molecules which might prevent filling. For example, helium passes easily though both the formable material 34 and the template 18. Other gases may be chosen depending on the properties of the formable material 34 and the template 18. An additional feature of the displacement gas may also be to displace gases which might inhibit the curing of the formable material during a step S716. The flow of the displacement gas may continue constantly until after the formable material 34 is cured so as to ensure that there is no gas which might interfere with polymerization in the imprint area. In an alternative embodiment, the displacement gas may be stopped at any time after which a sufficient amount of gas is displaced preferably after a time $T_2$ or time $T_4$. An advantage of stopping the gas early may be to introduce a gas which has different activity then displacement gas or to conserve the displacement gas.

In a step S708 a portion of the imprinting surface 22 of the template 18 may be brought into initial contact with the formable material 34 on the substrate 12 at a time $T_2$ as illustrated in FIG. 6A. Immediately after which in a step S710, portions of the rest of the imprinting surface 22 template 18 may then be brought gradually into contact with the formable material 34 on the substrate 12 in a controlled manner until a time $T_4$ as illustrated in FIG. 6A in which the entire imprinting surface 22 has been brought into contact with the formable material 34. Different portions of the imprinting surface 22 may be brought into contact with formable material 34, which causes the formable material 34 to spread in a controlled manner and possibly be extruded during a fill time which extends from time $T_2$ to a time $T_6$ as illustrated in FIG. 6A. The time $T_6$ being after time $T_4$.

In a step S712 an extrusion control gas may be discharged to evaporate or inhibit the curing of the extruded formable material 34 by discharging the extrusion control gas into the gap region 460. The extrusion control gas may be discharged via gas transport systems 36b and/or 36c. The extrusion control gas may be discharged during a time period from time $T_2$ to time $T_7$ as illustrated in FIG. 6A. In an alternative embodiment, the extrusion control gas begins flowing at a time $T_3$, $T_4$, or $T_5$. In an alternative embodiment, the extrusion control gas stops flowing at a time $T_6$, $T_7$, or $T_8$. In a step S714 the discharge rate of the extrusion control gas may be reduced to improve the accuracy of the feedback based alignment in a step S714 of the substrate 12 and the template 18 during a period between time $T_6$ and time $T_7$. Once the system is aligned, in a step S716 the formable material 34 is cured during a period between time $T_7$ and time $T_8$. After the formable material 34 is cured in a step S718 the template 18 may be separated from the substrate 12 after a time $T_8$. In one embodiment, additional processing is performed on the substrate 12 so as to create an article of manufacture (semiconductor device). In an embodiment, each imprinting field includes a plurality of devices.

The further processing may include etching processes to transfer a relief image into the substrate 12 that corresponds to the pattern in the patterned layer 46. The further processing in may also include known steps and processes for article fabrication, including, for example, curing, oxidation, layer formation, deposition, doping, planarization, etching, formable material removal, dicing, bonding, and packaging, and the like. The substrate 12 may be processed to produce a plurality of articles (devices).

Figure 7B:
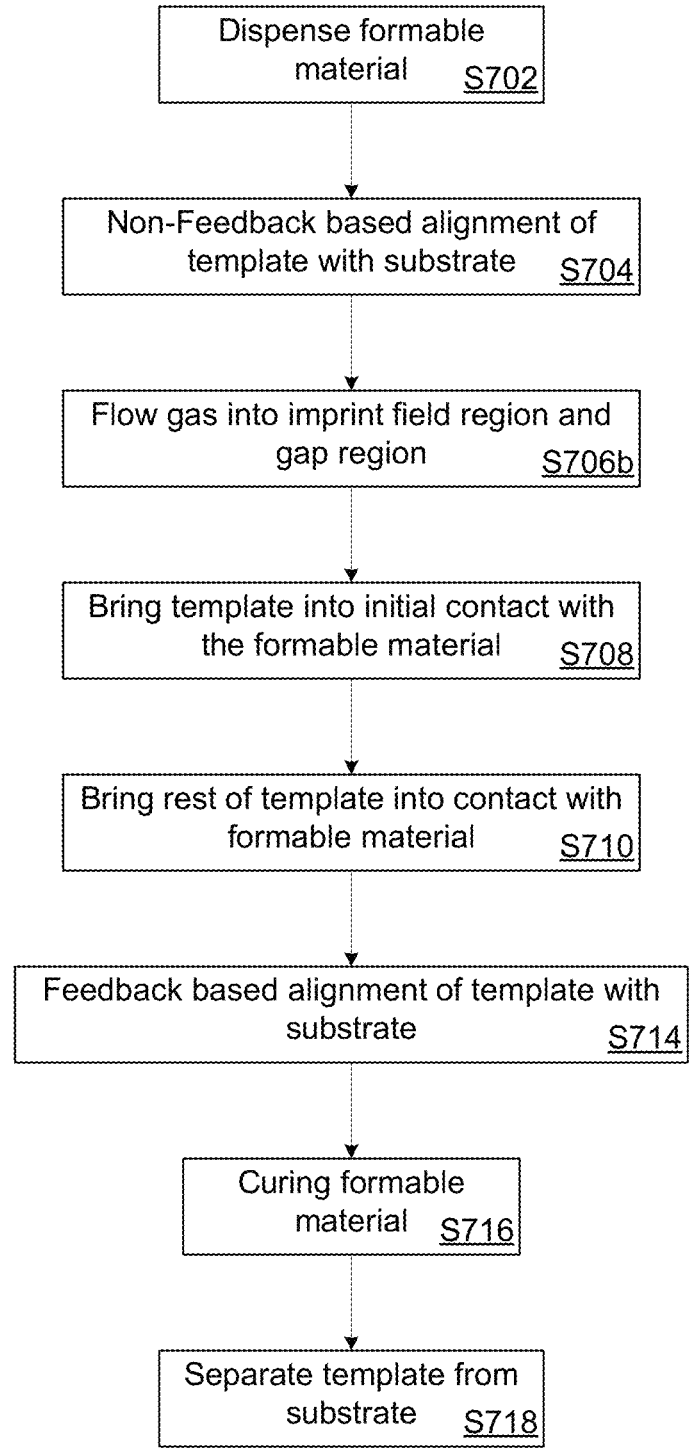

FIG. 7B is an illustration of an alternative method 700b that is substantially similar to method 700a, which may be used in combination with the first or second embodiment. In the alternative method 700b, the displacement gas and the extrusion control gas are the same gas and are flown during a step S704b substantially similar to step S704a according to timing diagram illustrated in FIG. 6B. Method 700b may be used in combination with a template that has larger gap (e.g. 100 μm) between the template 18 and substrate 12 which is less resistant to the flow of gas between the template 18 and substrate 12 and may not include holes 564. Method 700b may also be used with an embodiment, with a narrow gap in which the gas is flown through the holes 564 of the template 18.

Figure 7C:
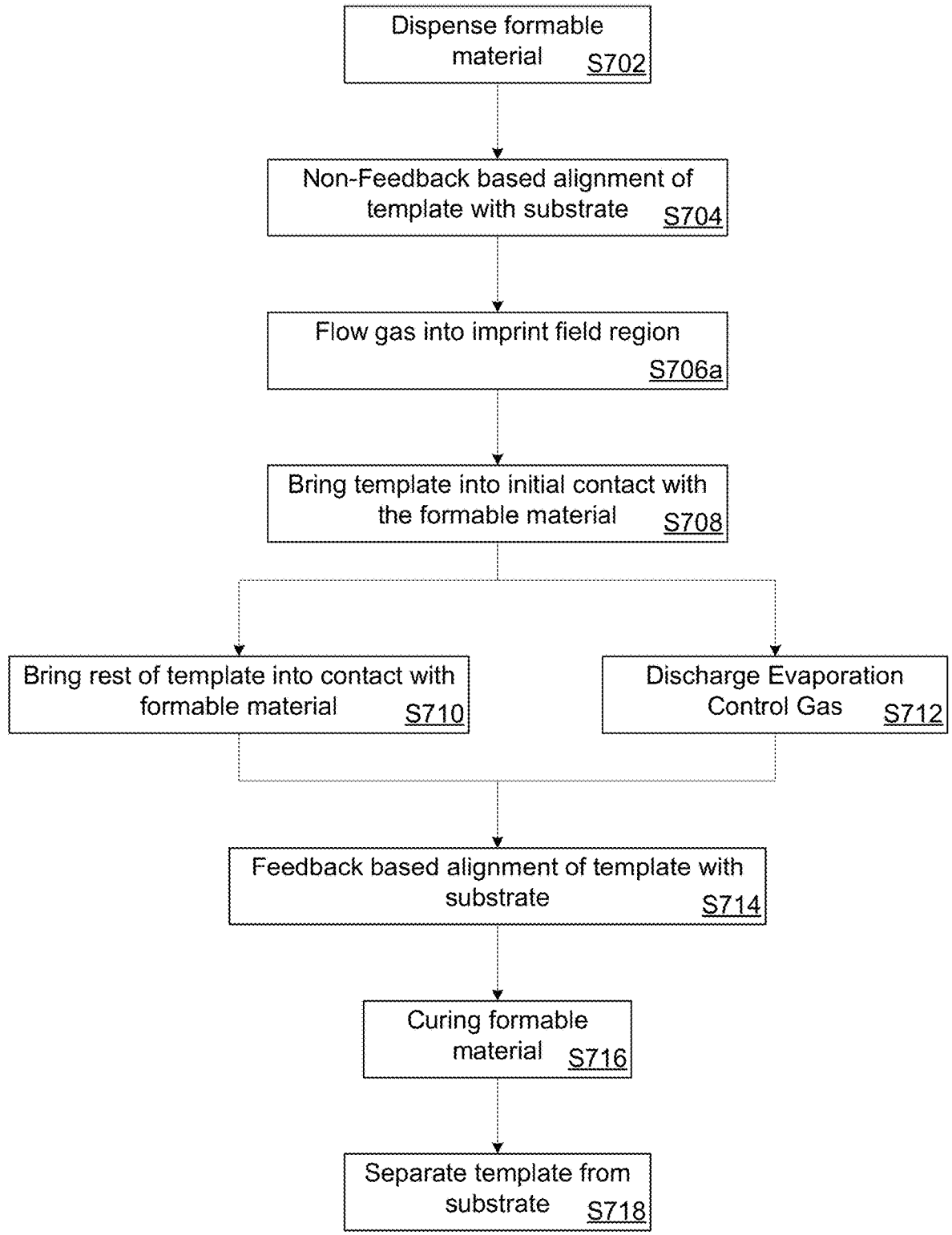

FIG. 7C is an illustration of an alternative method 700c that is substantially similar to method 700b, which may be used in combination with the first or second embodiment. In the alternative method 700c, the extrusion control gas starts flowing prior to or at the same time as step S710 as illustrated in timing diagram FIG. 6C. In the case, wherein the extrusion control gas is discharged prior to time $T_2$ the extrusion control gas is a gas (such as helium) which does not prevent the formable material 34 from filling indentations and does not interfere with the curing process.

The processor 54 may be configured to implement the methods 700a, 700b, and/or 700c by sending instructions to various components of the imprint apparatus 10. The methods 700a, 700b, and/or 700c may be stored as a series of computer readable instructions stored on a non-transitory computer readable medium.

Fourth Embodiment

The applicant has determined that supplying and evacuating gas through holes 564 may generate pressure between the substrate 12 and the template face 359. This pressure between the substrate 12 and the template face 359 can generate forces on both the imprint head which holds the template 18 and the substrate chuck 14. This force unless compensated for can result in a displacement of one or both of the imprint head and substrate chuck 14 during force control. For example, supplying through holes 564 with ~0.05 slpm CDA per hole for 550 msec starting 50 msec after time $T_4$ can successfully remove edge extrusions. Under these conditions, the template 18 may move in an upward direction by approximately 9 μm which can result in corners peeling from the edge. This displacement can cause numerous defects when dealing with small imprints such as nanoimprints.

An embodiment, may prevent this displacement by making use of a balanced pressure and/or flow approach to generate a net zero pressure distribution between the template face 359 and substrate 12 when supplying the holes 564 with process gases. One method of generating a net zero pressure imbalance in the gap region 460 is to supply two holes spaced 180° apart with positive pressure and the other two holes also spaced 180° apart are supplied with a negative pressure of the same magnitude. More generally an even number of holes 564 may be spread evenly around a central axis. Positive and negative pressure may be applied alternately among the even number of holes. While the absolute value of the pressure applied to the alternating holes may have substantially the same magnitude. The applicant has found that with this method vertical displacement of the template 18 or the substrate chuck 14 can be minimized.

A third method may include supplying gas (such as helium) to only one of the holes 564 while the rest of the holes (3 for example) are supplied with just enough vacuum such that the net force due to gas flow is zero. In one alternative, the vacuum is supplied evenly to each of the other holes. In a second alternative, the vacuum is not supplied evenly to the other holes.

A fourth method may include supplying the hole 564 or a combination of the holes 564 with a net negative pressure greater than the net positive pressure to intentionally produce a negative pressure in the gap region. A benefit of this method is that it may help prevent corners of the patterning surface 22 from peeling up.

A fifth method may include having a time averaged zero net pressure scheme. This fifth method may include switching between positive and negative pressure such that the time averaged pressure across all of the holes 564 is zero or slightly negative. For example, all the holes 564 are initially supplied with positive pressure (i.e. 10 kPa for 250 mssec) and then the same opposite pressure for the same period of time (i.e. −10 kPa for 250 msec). This would result in a time averaged zero net pressure between the wafer and mask. The gas and vacuum system 36 and gas transport system 36c may include a fast-acting switch that switches between pressure and vacuum. These methods can minimize any negative impact to filling, defects, image placement overlay, and alignment that may be caused by flowing gas through the holes 564 in the template 18 during one or more of the fill, alignment, and cure steps.

Figure 8A:
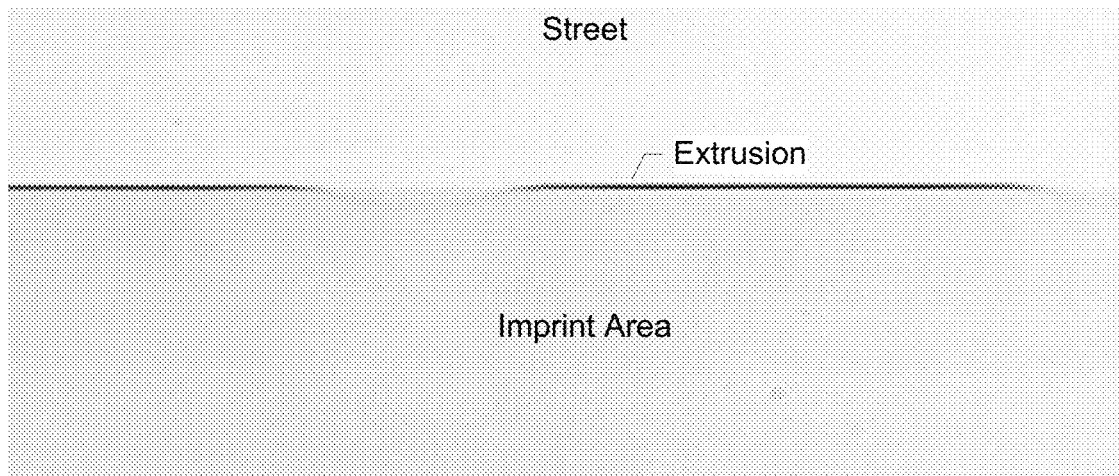
FIGS. 8A-B are illustration of a result of an imprinting process.
Figure 8B:
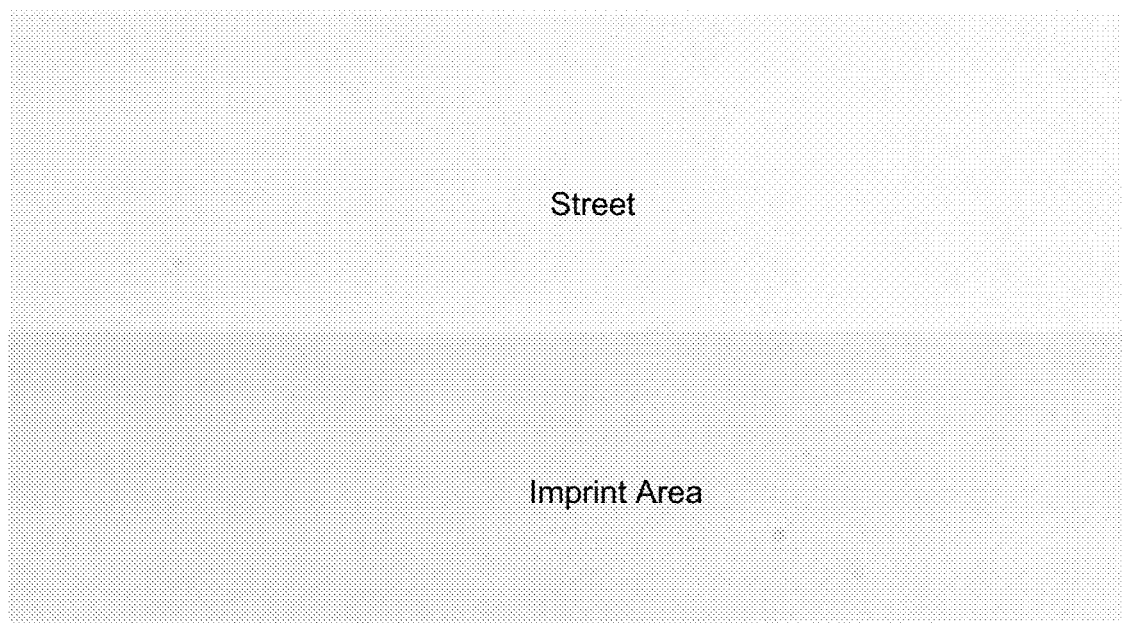

FIG. 8A is an illustration of a result of the imprint process in which gas was not circulated in accordance with an embodiment, note the extrusion between the street and the imprint area. FIG. 8B is an illustration of a result of the imprint process in which gas was circulated in accordance with an embodiment, note the lack of extrusion between the street and the imprint area.

The nanoimprint lithography system 10 along with the Piezo fluid dispensing system 32 can be used to fabricate devices on a substrate such as: CMOS logic; microprocessors; NAND Flash memory; NOR Flash memory; DRAM memory; MRAM; 3D cross-point memory; Re-RAM; Fe-RAM; STT-RAM; optoelectronics and other devices in which nanoimprint lithography is used as part of the fabrication process.

Other substrates materials can include but is not limited to: glass; fused silica; GaAs; GaN; InP; Sapphire, AlTiC; and other substrates well known in the art. Devices, fabricated on these substrates include patterned media, field effect transistor devices, heterostructure field effect transistors, light emitting diodes, read/write heads; and the like.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An imprint method comprising:
applying a plurality of droplets of a formable material to an imprint region of a substrate, wherein a partial pressure of the formable material develops at a fluid-gas interface of the formable material;
bringing a portion of an imprinting surface of a mesa on a template at an initial contact time into contact with the plurality of droplets of the formable material causing the plurality of droplets of the formable material to merge and flow towards an imprint edge interface between a mesa sidewall of the imprinting surface and the substrate;
causing a first gas to flow in a first region that includes the imprint region beginning prior to the initial contact time; and
causing a second gas to flow in a second region that includes the imprint edge interface and at least a portion of a gap region between the template and the substrate after the initial contact time;
wherein the second gas is different from the first gas; and
wherein the template and the flow of the second gas are configured to reduce the partial pressure of the formable material below a vapor pressure of the formable material in a portion of the gap region adjacent to the fluid-gas interface at the imprint edge interface.

2. The method of claim 1, wherein the second gas is one of: oxygen, clean dry air, nitrogen, argon, carbon dioxide, and helium.

3. The method of claim 1, wherein the first gas is helium and the second gas is one of oxygen, clean dry air, nitrogen, argon, and carbon dioxide.

4. The method of claim 1, wherein:
the first gas flows into the first region from the edge of the template;
the second gas flows from the edge of the template through the gap region and towards the mesa sidewall; and
the gap region is configured to have a thickness that is large enough to not substantially reduce the flow of the second gas from the edge of the template to the mesa sidewall.

5. The method of claim 4, wherein both the first gas and the second gas flow towards the edge of the template through the same gas nozzles.

6. The method of claim 4, wherein the thickness of the gap region is greater than or equal to 100 µm.

7. The method of claim 1, wherein:
the second gas flows through a plurality of holes in the template into the gap region; and
the flow of the second gas into the gap region is configured to circulate gas in and out of the gap region reducing the partial pressure of the formable material below the vapor pressure of the formable material in the portion of the gap region adjacent to the fluid-gas interface at the imprint edge interface.

8. The method of claim 7, wherein the first gas flows into the first region through the plurality of holes in the template and from the edge of the template.

9. The method of claim 7, wherein the first gas flows into the first region from the edge of the template.

10. The method of claim 7, wherein the first gas flows through the plurality of holes in the template.

11. The method of claim 1, wherein the gap region is bounded by: the mesa sidewall, the substrate, a template face, and an edge of the template face.

12. The method of claim 7, wherein:
the second gas flows both in and out of the gap region through the plurality of holes;
a positive pressure is applied to one or more of the plurality of holes;
a negative pressure is applied to one or more of the plurality of holes; and
a net pressure of the positive pressure and the negative pressure is zero or less than zero.

13. The method of claim 12, wherein, the net pressure is a time averaged pressure.

14. The method of claim 1, wherein a flow rate of the second gas is lower than a flow rate of the first gas.

15. The method of claim 1, wherein:
the first gas displaces an undesirable gas from the imprint region;
the undesirable gas inhibits polymerization;
the second gas is or includes the undesirable gas; and
the second gas begins flowing after the formable material has filled regions of interest in the imprint field.

16. The method of claim 1, wherein the second gas is one of oxygen, clean dry air, and an oxygen containing mixture.

17. The method of claim 1, wherein:
the flow of the second gas begins at or after the initial contact time;
the flow of the second gas is reduced or terminated at a beginning of a feedback based alignment period.

18. A method of manufacturing an article comprising:
patterning a substrate comprising:
applying a plurality of droplets of a formable material to an imprint region of the substrate, wherein a partial pressure of the formable material develops at a fluid-gas interface of the formable material;
bringing a portion of an imprinting surface of a mesa on a template at an initial contact time into contact with the plurality of droplets of the formable material causing the plurality of droplets of the formable material to merge and flow towards an imprint edge interface between a mesa sidewall of the imprinting surface and the substrate;
causing a first gas to flow in a first region that includes the imprint region beginning prior to the initial contact time; and
causing a second gas to flow in a second region that includes the imprint edge interface and at least a portion of a gap region between the template and the substrate after the initial contact time;
wherein the second gas is different from the first gas; and
wherein the template and the flow of the second gas are configured to reduce the partial pressure of the formable material below a vapor pressure of the formable material in a portion of the gap region adjacent to the fluid-gas interface at the imprint edge interface; and
perform additional processing on the substrate so as to manufacture the article.

\* \* \* \* \*